United States Patent [19]

Kudo

[11] Patent Number: 5,061,899
[45] Date of Patent: Oct. 29, 1991

[54] TRANSFER IMPEDANCE TESTING FIXTURE FOR ELECTROMAGNETIC WAVE SHIELDING MATERIAL

[75] Inventor: Toshio Kudo, Hyogo, Japan

[73] Assignee: Mitsubishi Cable Industries Ltd., Hyogo, Japan

[21] Appl. No.: 482,802

[22] Filed: Feb. 21, 1990

[30] Foreign Application Priority Data

Feb. 23, 1989 [JP] Japan .................................. 1-44630
Feb. 23, 1989 [JP] Japan .................................. 1-44631
Dec. 1, 1989 [JP] Japan .................................. 1-313818

[51] Int. Cl.$^5$ .......................................... G01R 27/00
[52] U.S. Cl. ................................ 324/627; 174/35 MS
[58] Field of Search ....................................... 324/627; 174/35 MS FILE

[56] References Cited

U.S. PATENT DOCUMENTS

| 2,446,195 | 8/1948 | Shive | 324/627 |
| 2,462,106 | 2/1949 | Kram | 324/627 |
| 3,839,672 | 10/1974 | Anderson | 324/627 |
| 3,952,245 | 4/1976 | Miller | 324/627 |
| 4,281,284 | 7/1981 | Stutz et al. | 324/627 |

Primary Examiner—Kenneth A. Wieder
Assistant Examiner—Maura K. Regan

[57] ABSTRACT

A testing fixture for testing a transfer impedance of an electromagnetic wave shielding material including a pair of coaxial reducers opposed to each other, each of the coaxial reducers including a cylindrical outer conductor and an inner conductor disposed therein. Each of the outer conductors is provided with a flange at the outer side for engaging the pair of coaxial reducers. Contacting parts are positioned at an end of the opposing outer conductors. Outer connectors are positoned at the other end of the opposing outer conductors. Each of the inner conductors includes head parts positioned at the inside portions thereof and inner connectors positioned at the outside portions thereof. The contacting parts of the outer conductors and the head parts of the inner conductors support the electromagnetic wave shielding material. The outer connectors of the outer conductors and the inner connectors of the inner conductors couple coaxial cable to the testing fixture. Inner contacts are provided between the head parts and the inner connectors in at least one of the inner conductors so that the inner contacts are slidably engaged against the head part to ensure a reliable test measurement.

13 Claims, 8 Drawing Sheets

TRANSFER IMPEDANCE TESTING FIXTURE FOR ELECTROMAGNETIC WAVE SHIELDING MATERIAL

BACKGROUND OF THE INVENTION

The present invention relates to a transfer impedance testing fixture for detecting the shielding characteristics of an electromagnetic wave shielding material in terms of the transfer impedance used for preventing electromagnetic wave interference (EMI).

As electronic devices have been recently become popular, the electromagnetic wave noise emitted from the electronic devices causes problems. For instance, the electromagnetic wave noise emitted from electronic devices causes other electronic devices to malfunction and adversely affects the human body. To avoid these problems, various types of electromagnetic wave shielding materials have been developed. For development, it is necessary to determine the shielding characteristics of the electromagnetic wave shielding materials. Conventionally, to evaluate the shielding characteristics of these materials, the following testing methods have been proposed.

(1) While the emission power of the electromagnetic wave is set constant, induced electromotive force $P_1$ is measured by a receiving antenna when there is positioned a sample of an electromagnetic wave shielding material between a transmitting antenna and the receiving antenna. Similarly, induced electromotive force $P_0$ is measured by the receiving antenna when there is no positioned sample of shielding material. With the following calculation, the shielding characteristics of the sample are evaluated.

$$Se' = 10 \cdot \log P_0/P_1 \qquad (1)$$

(2) At the center of a coaxial testing fixture, an output power $P_1$ is measured when a sample is inserted between an outer conductor and an inner conductor, and another output power $P_0$ is measured when no sample is inserted. The above $Se'$ is calculated.

(3) A TEM cell for emitting the electromagnetic wave and a TEM cell for detecting it are combined via a window. A sample is positioned at the window to measure a detection power $P_1$.

Another detection power $P_0$ is measured with no sample. The above $Se'$ is calculated.

However, all of the above three methods require correction factors since the value of $Se'$ depends on the size of the sample. The above methods are therefore inappropriate to accurately evaluate the shielding characteristics of the electromagnetic wave shielding materials.

On the contrary, a new method has been proposed for evaluating the shielding characteristics by testing the transfer impedance (See, for example, SAE ARP-1705 "Coaxial Test Procedure to Measure the RF Shielding Characteristics of EMI Gasket Materials").

FIG. 12 shows a system for measuring transfer impedance in which a current is directed to flow through the sample wall of the electromagnetic wave shielding material T with current set as I and voltage set as V, respectively. The transfer impedance Zt is calculated.

$$Zt = V/I$$

The shielding characteristics are then calculated as follows.

$$Se = K \cdot Zw/Zt \qquad (2)$$

K is a coefficient depending on the measurement system impedance of the testing fixture and Zw is a wave impedance (For example, $K = 50/120\pi$ in a 50Ω system).

According to this method, as compared with the aforementioned three methods, measurement variations due to the size and the shape of the sample of electromagnetic wave shielding material does not occur, and the system operates without any necessity of correction. The measured value Se is suitable for evaluating the shielding characteristics of the shielding material.

The conventional system for measuring the transfer impedance as disclosed in the above-referenced article is directed mainly to measuring a gasket, so that it is not suitable for measuring the transfer impedance of any electromagnetic wave shielding material of sheet-like or one foil-like form.

Basically, the conventional system is too complicated to easily set a sample to measure. Further, impedance matching between an outer conductor and an inner conductor cannot be established in the conventional system, resulting in the disadvantageous effect of reflection by a high frequency.

SUMMARY OF THE INVENTION

With the foregoing in mind, it is an object of the present invention to provide an improved testing fixture for easily and precisely measuring the transfer impedance of the electromagnetic wave shielding materials.

Briefly described, to attain the above object, in accordance with the present invention, a testing fixture for measuring the transfer impedance of the electromagnetic wave shielding materials comprises a pair of coaxial reducers engaged to each other. Each of the pair of coaxial reducers comprises a cylindrical outer conductor and an inner conductor positioned therein. Each of the outer conductors is provided with a flange at the outer side for engaging the pair of coaxial reducers. Contacting parts are positioned at an end of the opposing outer conductors. Outer connectors are positioned at the other end of the opposing outer conductors. Each of the inner conductors includes head parts positioned at the inside portions thereof and inner connectors positioned at the outside portions thereof.

The electromagnetic wave shielding materials are supported by the contacting parts of the outer conductor and the head parts of the inner conductors.

The coaxial cables are connected to the outer connectors of the outer conductors and the inner connectors of the inner conductors.

Inner contacts are provided between the head parts and the inner connectors in at least one of the inner conductors. The inner contacts are slidably engaged against the head part.

With the above-mentioned structure, accurate shield characteristics can be determined by calculating the above value Se of calculation (2). By separating the couple of coaxial reducers, the sample of the electromagnetic wave shielding material to be set between the couple of coaxial reducers can be easily removed.

Further, the case where a elastic test sample such as a gasket is tested, depending on the pressure of the engagement of the flange in the outer conductor, the engaging point of the outer conductor may be shifted in the axial direction. However, since the inner contact composed of the inner conductor is engaged slidably to the head, the shift of the engaging point of the outer conductor can be absorbed to assure stable measurement. When and if both of the inner contacts of the inner conductors are set slidably against the heads, stabler measurement can be established.

If a serial resistor is provided to each of the inner conductors, the resistor having a resistance substantially equivalent to the characteristic impedance of the measurement system in order to provide impedance matching, the effect of reflection can be fully removed to further accurately measure the transfer impedance up to a high frequency range.

Additionally, an annular outer contact can be slidably interposed between the outer sides of the outer conductors of one of the pair of coaxial reducers. The annular outer contact has a longitudinal length in contact with both of the outer conductors. With the additional structure, in the flange in which the outer conductors are engaged to each other, the outer conductors are directly conducted via the outer contact, so that resonance phenomena can be restrained in a thick electromagnetic wave shielding material, a gasket sample, or poor shielding materials, thereby preventing measurement error.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

Figure 1:
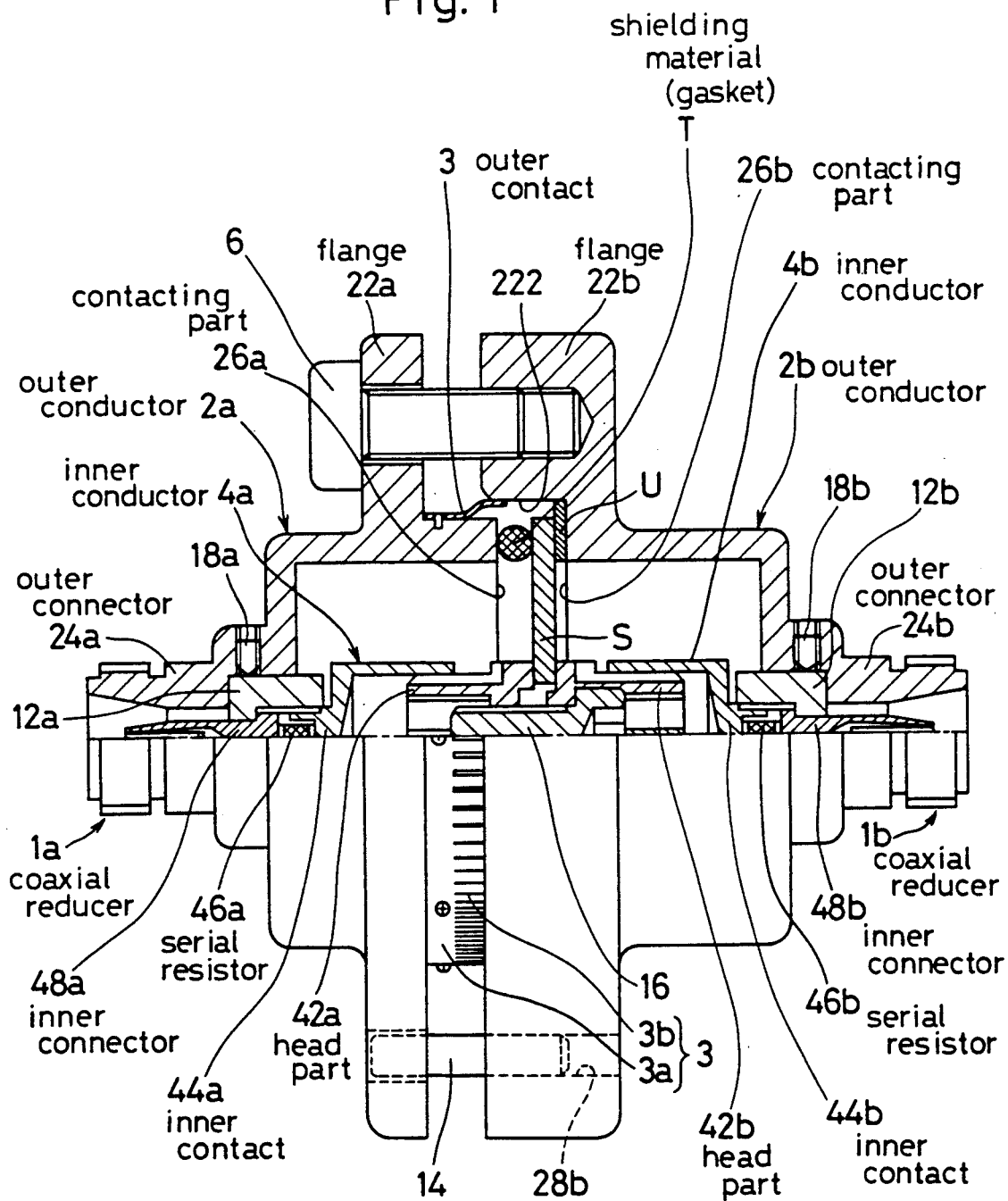
FIG. 1 is a side view of a transfer impedance testing fixture according to a preferred embodiment of the present invention, with its upper half broken.

FIG. 1 is a side view of a transfer impedance testing fixture of an electomagnetic wave shielding material according to a preferred embodiment of the present invention, with its upper part broken.

Figure 2:
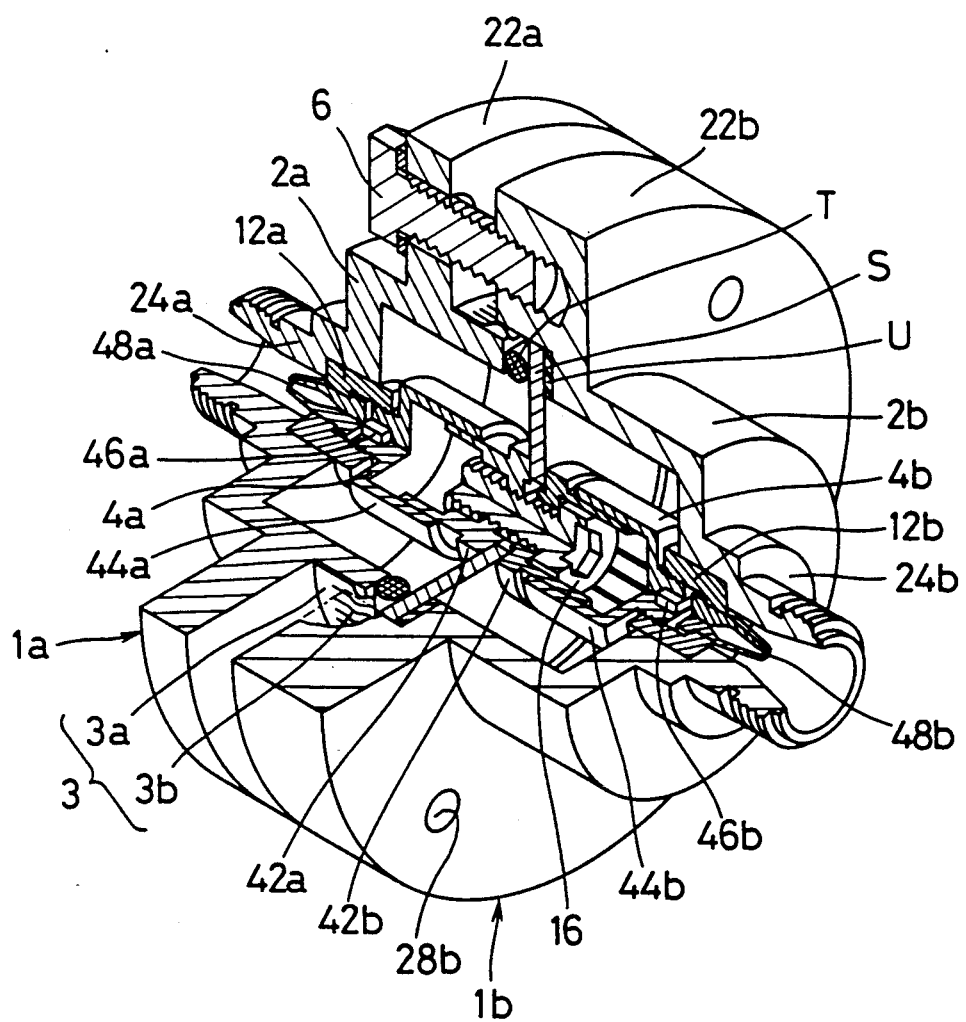
FIG. 2 is a perspective view of the inner parts of the fixture of FIG. 1.

FIG. 2 is a perspective view of the testing fixture of FIG. 1, with some parts broken.

With reference to these drawings a pair of coaxial reducers 1a and 1b are faced to each other. Cylindrical outer conductors 2a and 2b, and inner conductors 4a and 4b to be positioned within the outer conductors 2a and 2b are provided.

At the opposing side between the outer conductors 2a and 2b, contacting parts 26a and 26b are provided for supporting on electromagnetic wave shielding material T.

At the outer sides of the outer conductors 2a and 2b, flanges 22a and 22b are provided for engaging the pair of coaxial reducers 1a and 1b. The flange 22b in the right side of FIG. 1 has a ringlike concavity 222 in which a contacting part 26a of the left side is engaged.

Some points of the flanges 22a and 22b are engaged by bolts 6. At the facing plane between the flanges 22a and 22b, a knock pin 14 is provided for positioning the circumferential position to be inserted into an insertion hole 28b provided in the flange 22b. The contacting parts 26a and 26b are provided at the opposing position between the outer conductors 2a and 2b for supporting a sample T of the electromagnetic wave shielding material. At the end opposed to the contacting parts 26a and 26b, outer type N female connectors 24a and 24b are provided for connecting a coaxial cable.

Inner conductors 4a and 4b comprise head parts 42a and 42b, inner contacts 44a and 44b, and inner connector 48a and 48b. The head parts 42a and 42b function to support the sample T of the shielding material. The inner contacts 44a and 44b are slidably engaged with the head parts 42a and 42b. The inner connectors 48a and 48b are electrically connected to the inner contacts 44a and 44b via serial resistors 46a and 46b for impedance matching, in order to connect the coaxial cable. The resistance r of each of the serial resistors 46a and 46b is set to 50Ω so as to match the characteristic impedance of the measurement system. The head parts 42a and 42b have slits at the contact portion with the inner contacts 44a and 44b. The head parts 42a and 42b are joined to each other by a bolt 16. Insulators 12a and 12b are coaxially disposed between the outer conductors 2a and 2b, and the inner conductors 4a and 4b. The insulators 12a and 12b have in their inner parts screws for binding the serial resistors 46a and 46b in conjunction with the inner conductors 4a and 4b. The insulators 12a and 12b are fixed to the outer conductor 2a and 2b via screw 18a and 18b, respectively.

The sample T of the electromagnetic wave shielding material is a gasket. A hollow disk conductor S is provided for coupling the inner conductors 4a and 4b and the outer conductors 2a and 2b. A hollow disk insulator plate U is interposed between the hollow disk conductor S and the outer conductor 2b. To maintain the low contact resistance between the test sample T and the testing fixture, the outer conductors 2a and 2b are plated with silver and the inner conductors 4a and 4b are plated with gold.

Further, in this preferred embodiment of the present invention, an annular outer contact 3 is interposed between the circumferential sides of the outer conductors 2a and 2b of the coaxial reducers 1a and 1b. The outer contact 3 has a longitudinal length corresponding to the contact area of the outer conductors 2a and 2b. The outer contact 3 is made of an elastic spring conductor such as beryllium copper or phosphor bronze or the like. The outer contact 3 comprises a ring substrate 3a and a contact brush 3b in an arch-shaped manner extended from the ring substrate 3a. The ring substrate 3a is attached to the outer side of the outer conductor 2a while the contact brush 3b rests against the flange 22b of the outer conductor 2b under the condition that the gasket T, the disk conductor S and the insulator plate U are all attached. The outer contact may be made of elastic and electrically conductive rubber.

In the fixture of the present invention, in order to attach the gasket T, first the screws in the head parts 42a and 42b are engaged to each other to support the hollow disk conductor S. Next, the gasket T is disposed between the hollow disk conductor S and the contacting part 26a of the outer conductor 2a. Under the circumstances, the head part 42a is inserted into the inner contact 44a. The insulator plate U is disposed between the disk conductor S and the contacting part 26b of the outer conductor 2b. The knock pin 14 is inserted into the insertion hole 28b with positioning, so that the head part 42b is inserted into the inner contact 44b. The bolt 6 is secured for engaging the flanges 22a and 22b of the outer conductors 2a and 2b.

In such a case, depending on the change of thickness of the gasket T, the engaging position of the outer conductors 2a and 2b is shifted in the axial direction. However, this shifting out of position can be absorbed since the inner contacts 44a and 44b are engaged slidably to the head part 42a and 42b. The opposing flanges 22a and 22b of the outer conductors 2a and 2b are directly contacted via the outer contact 3.

The transfer impedance testing fixture of the present invention is used to measure the transfer impedance of the gasket T as follows. The gasket T is set as described above. A signal generator A is electrically connected to the outer connector 24a and the inner connector 48a via the coaxial cable. A level meter B is electrically connected to the outer connector 24b and the inner connector 48b via the coaxial cable.

Figure 3:
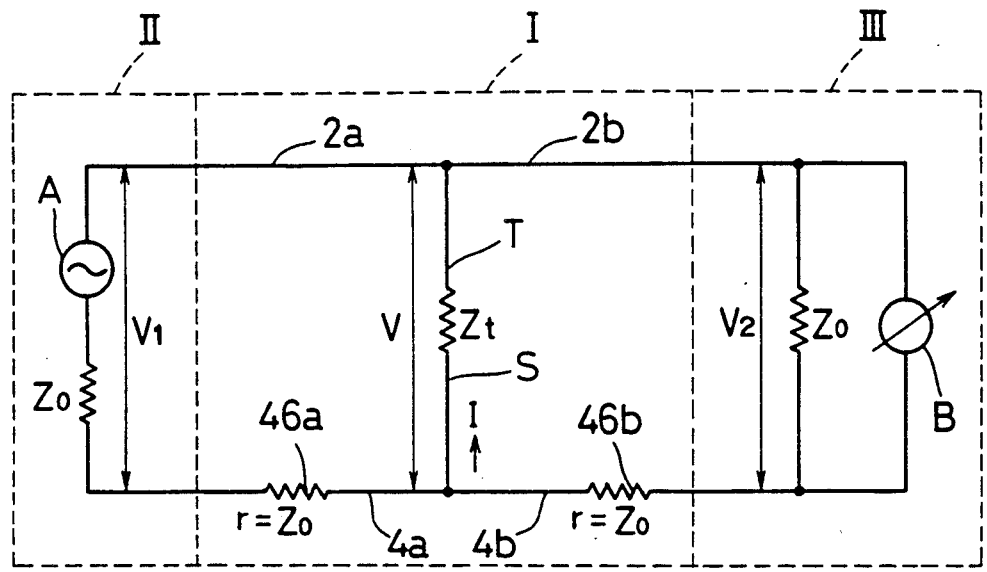
FIG. 3 is an equivalent circuit for testing the transfer impedance of an electromagnetic wave shielding material.

FIG. 3 is an equivalent circuit of the transfer impedance testing fixture of the present invention when the signal generator A and the level meter B are connected to the testing fixture of the present invention. In FIG. 3, a part I corresponds to the testing fixture, a part II corresponds to the signal generator A, and a part III corresponds to the level meter B. Zo represents characteristic impedance of measurement system, Zt represents transfer impedance of the gasket, r is a resistance of resistors 46a and 46b connected for impedance matching, I is a current flowing through the gasket T via the disk conductor S, V is a voltage applied to the gasket T, $V_1$ is an output voltage from the signal generator A, and $V_2$ is a voltage measured by the level meter B. Then, the transfer impedance Zt is represented as follows.

$$Zt = V/I \quad (3)$$

Here, since normally $Z_0 \gg Zt$, $$I = V_1/Z_0 \quad (4)$$

When the characteristic impedance $Z_0$ of the measurement system is preliminarily set as indicated in FIG. 3, $$V = 2 V_2 \quad (5)$$

When the equations (4) and (5) are substituted for the equation (3), $$Zt = V/I = 2 Z_0 \cdot V_2/V_1 \quad (6)$$

Thus, when the transfer impedance Zt is calculated by $V_1$ and $V_2$, the shielding characteristic Se can be determined.

Figure 4:
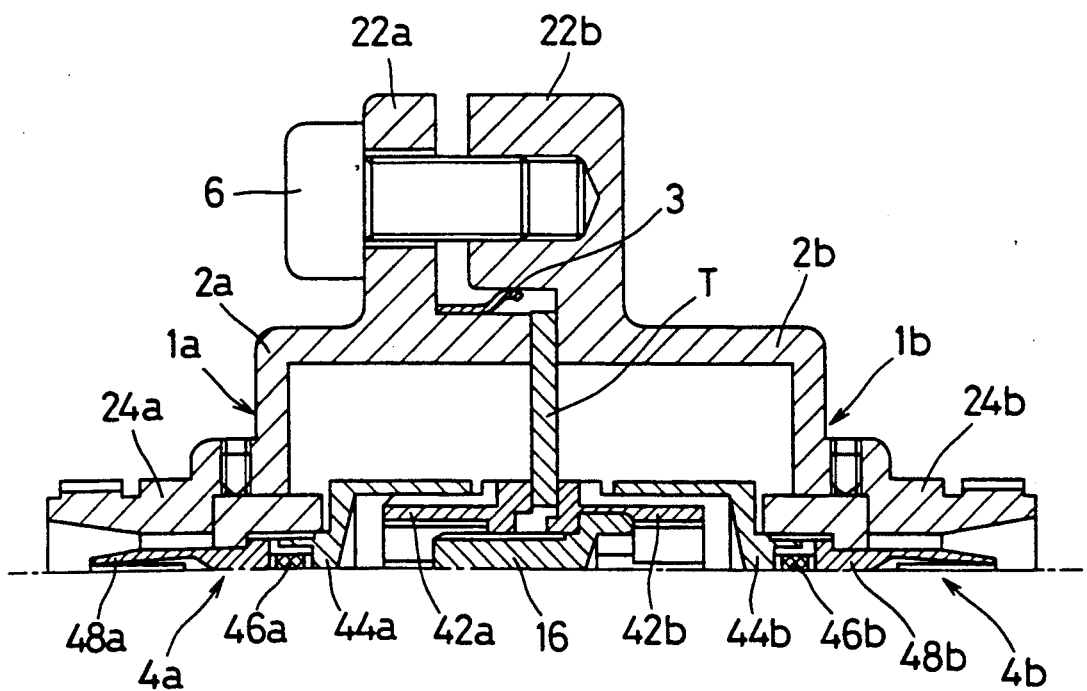
FIG. 4 is a side view of the transfer impedance testing fixture, showing an example of an accommodating sample of the electromagnetic wave shielding material.

When the transfer impedance of a sample of a hollow disc electromagnetic wave shielding material is checked as shown in FIG. 4, the disk conductor S and the insulator plate U are not necessary. Instead, the contacting parts 26a and 26b of the outer conductors 2a and 2b hold the outside of the shielding material T while the head parts 42a and 42b of the inner conductors 4a and 4b engage the inside of the material T with the bolt 16.

Similarly as in the case of the above-stated preferred embodiment, according to the material of the shielding material T such as the rubber or the gasket, the engagement position of the outer conductors 2a and 2b may be shifted in the axial direction. However, this shift can be absorbed because the inner contacts 44a and 44b are slidably engaged against the head parts 42a and 42b. With adjusting the engagement force of the contacting parts 26a and 26b in the outer conductors 2a and 2b of the shielding material T, the contact pressure at the electromagnetic wave shielding material T can be set at a desired value. Thus, the stable measurement data can be obtained. Further, the opposing flanges 22a and 22b of the outer conductors 2a and 2b are directly contacted via the outer contact 3.

Figure 5:
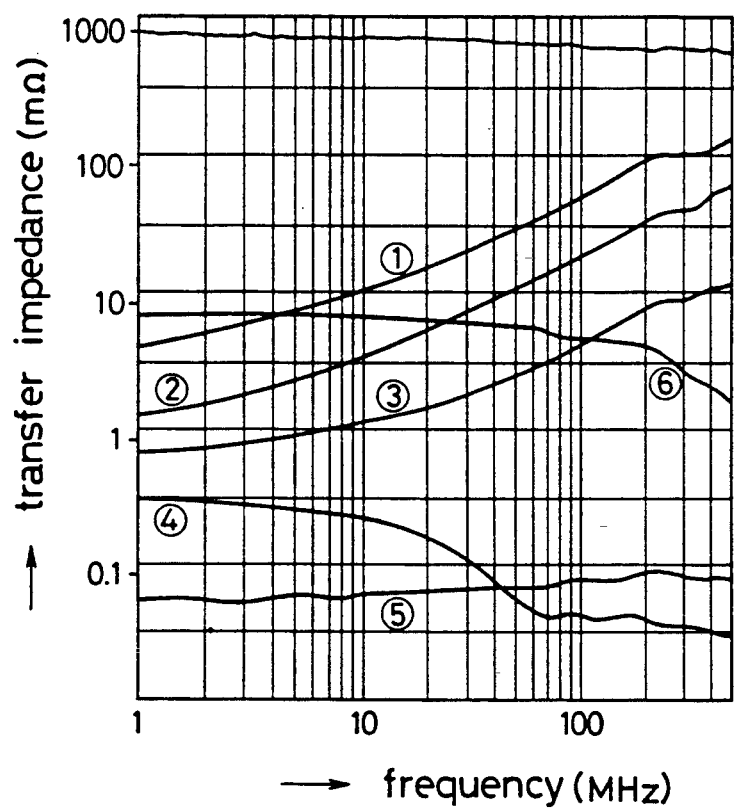
FIG. 5 is a graph of the transfer impedance data measured with the fixture of FIG. 1 or 4.

FIG. 5 is a graph of transfer impedance data Zt measured with the testing fixture of FIG. 1 or 4.

In this graph, a resistance of the serial resistors 46a and 46b is 50Ω, the inner diameter of the outer conductors 2a and 2b is 38.8 mm, the outer diameters of the head parts 42a and 42b in the inner conductors 4a and 4b is 16.9 mm, and the distance between the shielding material sample T and the serial resistors 46a and 46b is 45.0 mm. Under these conditions, the following shielding material samples to were tested to measure the transfer impedances.

Ni-platted Fe foil having a number of fine perforations; the thickness=0.10 mm, the perforation diameter=2.00 mm, the perforated ratio 58%

Fe foil having a number of fine perforations; the thickness=0.10 mm, the perforation diameter=1.7 mm, the perforated ratio=40%, Ni-plated Fe foil having a number of fine perforations; the thickness=0.10 mm, the perforation diameter=1.0 mm the perforated ratio=19%

Ni-plated Fe foil without any perforation; the thickness 0.10 mm.

Cu-plated unwoven cloth made of polyester; the thickness=84 μm, the surface resistance=0.08Ω/□

Copper foil with rust-resistance treatment, coated with adhesive; the thickness of the copper foil=35 μm, the thickness of the adhesive=30 μm.

As shown in the graph of FIG. 5, all of the electromagnetic wave shielding materials show stable measurement data at the high frequency range up to 1.000 MHz.

Figure 6:
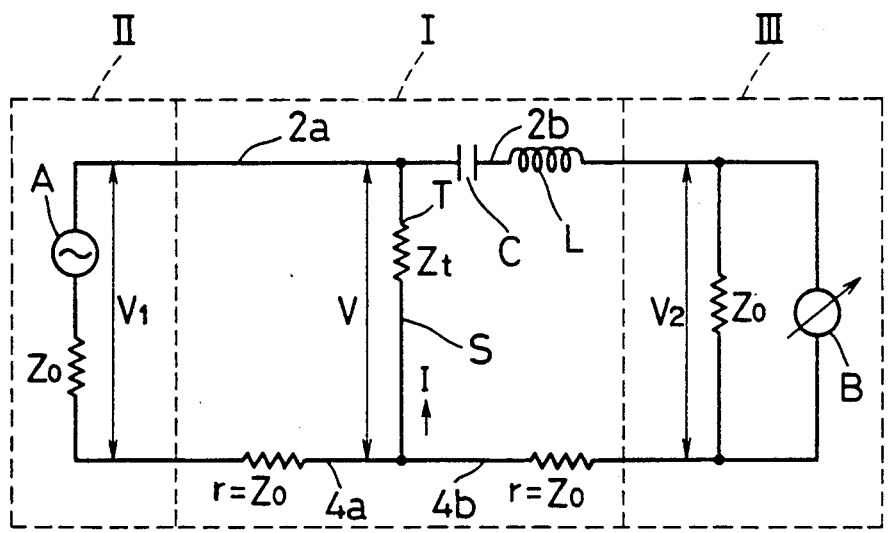
FIG. 6 is an equivalent circuit of the testing fixture without any provision of an outer contact.

As mentioned before, in the testing fixture of FIGS. 1 and 4, the opposing flanges 22a and 22b of the outer conductors 2a and 2b are directly conducted via the outer contact 3. The reason is as follows. For instance, when the sample T is a gasket, without the provision of the outer contact 3, the current from the inner conductors 4a and 4b may flow through one outer conductor 2a via the disk conductor S and the gasket T. Further, in the structural sense, the current may flow from one flange 22a to the other flange 22b via the bolts 6. However, since the number of engaging the bolts 6 along the circumferential side of the flanges 22a and 22b is several, in the sense of high frequency, the outer conductors 2a and 2b are coupled via the floating capacitance C between the flanges 22a and 22b. The outer conductors 2a and 2b have a reactance component L. Therefore, without the provision of the outer contact 3, the equivalent circuit for measuring the transfer impedance of the gasket T is as shown in FIG. 6. That is, there is an LC component in the measurement circuit I, so that some resonance may occur in a certain frequency during measurement to disturb accurate measurement, disadvantageously. Similarly, in case the hollow disk electromagnetic wave shielding material T as shown in FIG. 4 is used, the space between the flanges 22a and 22b becomes too much when the thickness of the material T is too thick. Then, the outer conductors 2a and 2b are coupled in the sense of high frequency via the floating capacitance C, so that some resonance may occur to disturb accurate measurement.

In contrast, according to the present invention, the opposing flanges 22a and 22b of the outer conductors 2a and 2b are directly contacted via the outer contact 3 so as to eliminate the floating capacitance C. Accordingly, resonance due to the LC component can be restricted.

Therefore, any shaped material such as the gasket and the hollow disk shielding material, and any poor-shielding material can be accurately measured.

Figure 7:
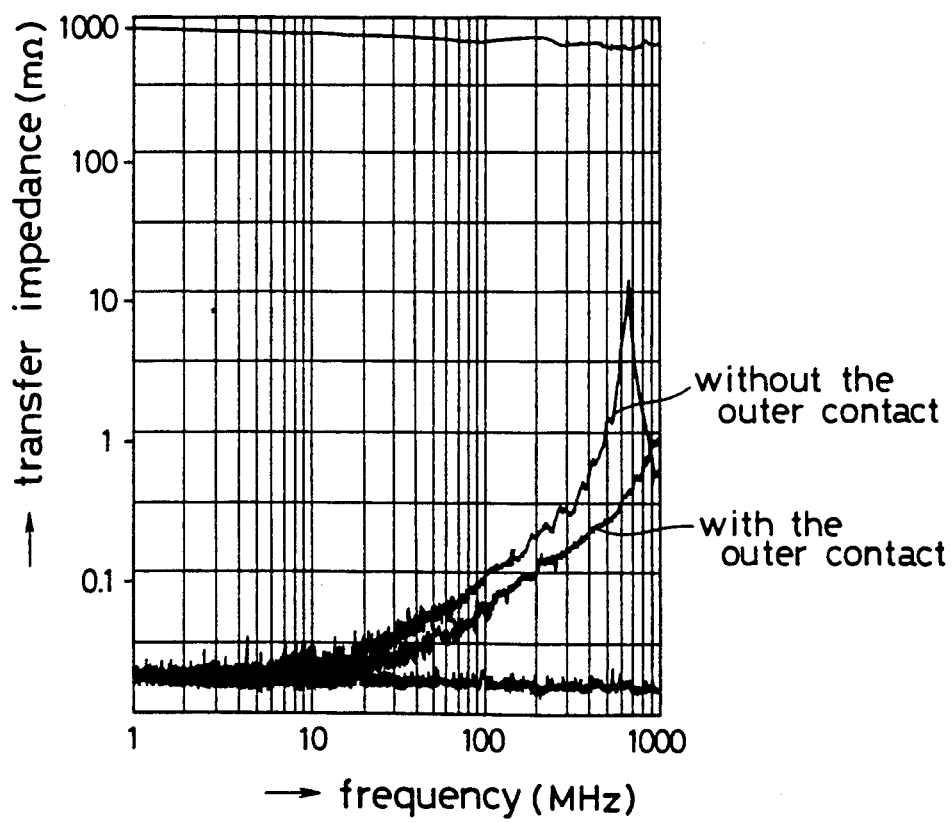
FIG. 7 is a graph of the transfer-impedance data measured with and without the provision of the outer contact.
Figure 10:
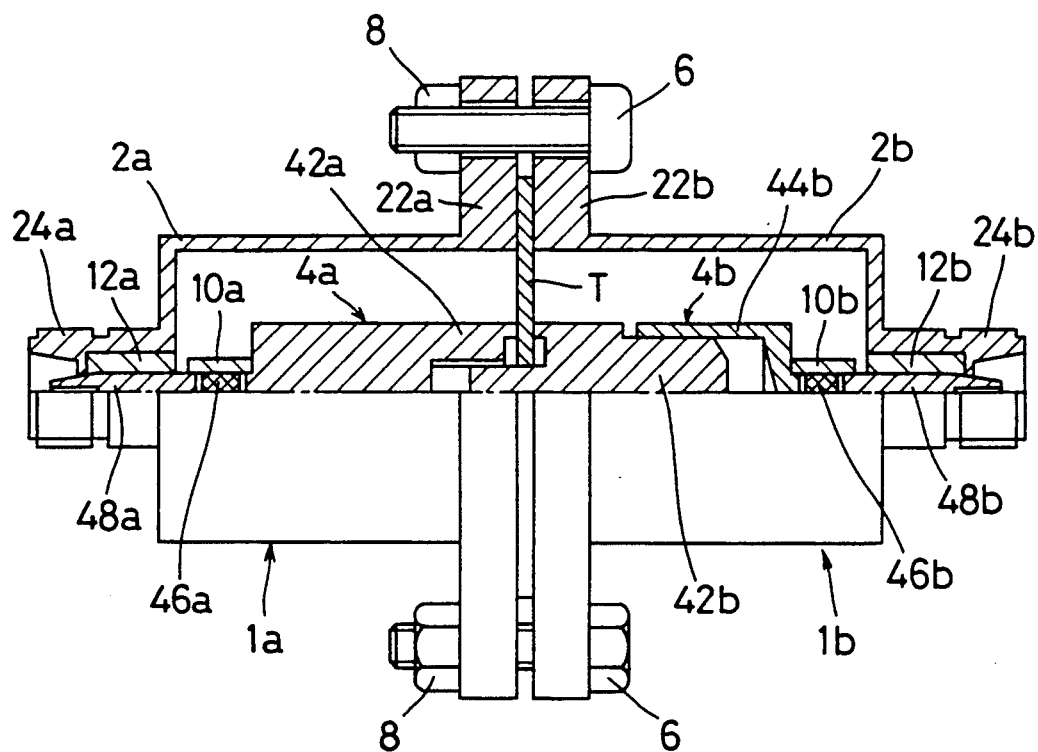
FIG. 10 is a side view of another transfer impedance testing fixture.
Figure 12:
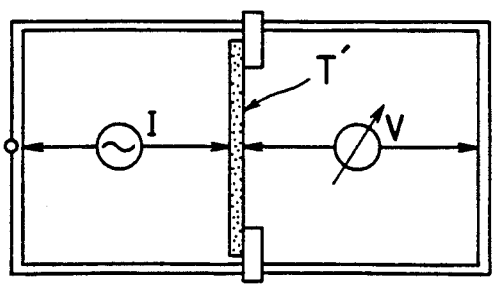
FIG. 12 is an explanation of the measurement principle of the transfer impedance.

FIG. 7 is a graph showing measurement data which confirms the effect the provision of the outer contact 3. In FIG. 7, a test sample is a gasket with an outer diameter of 3 mm. For comparison, FIG. 7, shows measurement data of the testing fixture without any outer contact as shown in FIG. 10. As is apparent from FIG. 7, without the outer contact 3, a resonance phenomenon occurs in a certain frequency (in FIG. 7, about 700 MHz). The resonance can be prevented through the use of the outer contact 3.

Figure 8:
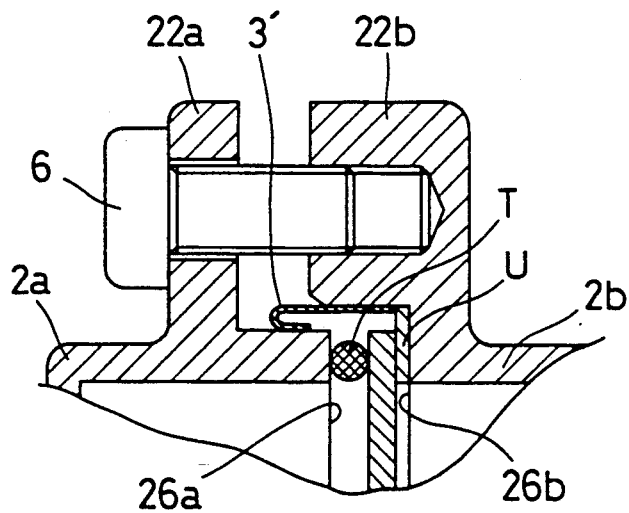
FIG. 8 is a side view of the testing fixture showing another outer contact.

In the above preferred embodiment, one end of the outer contact 3 is fixed to the outer one side of the outer conductor 2a while the other end of the outer contact 3 is in contact with the inner side of the outer conductor 2b. Alternatively, as shown in FIG. 8, one end of the outer contact 3' is fixed to the inner side of the outer conductor 2b while the other end of the outer contact 3' is in contact with the outer side of the outer conductor 2a through an annular element with a u-shaped section.

In the preferred embodiment as shown in FIGS. 1, 2, and 4, the serial resistors 46a and 46b having approximately the characteristic impedance of the measurement system are coupled to the inner conductors 4a and 4b, respectively, for impedance matching. This can eliminate the effect by reflection to assure more accurate measurement of the transfer impedance.

Figure 9:
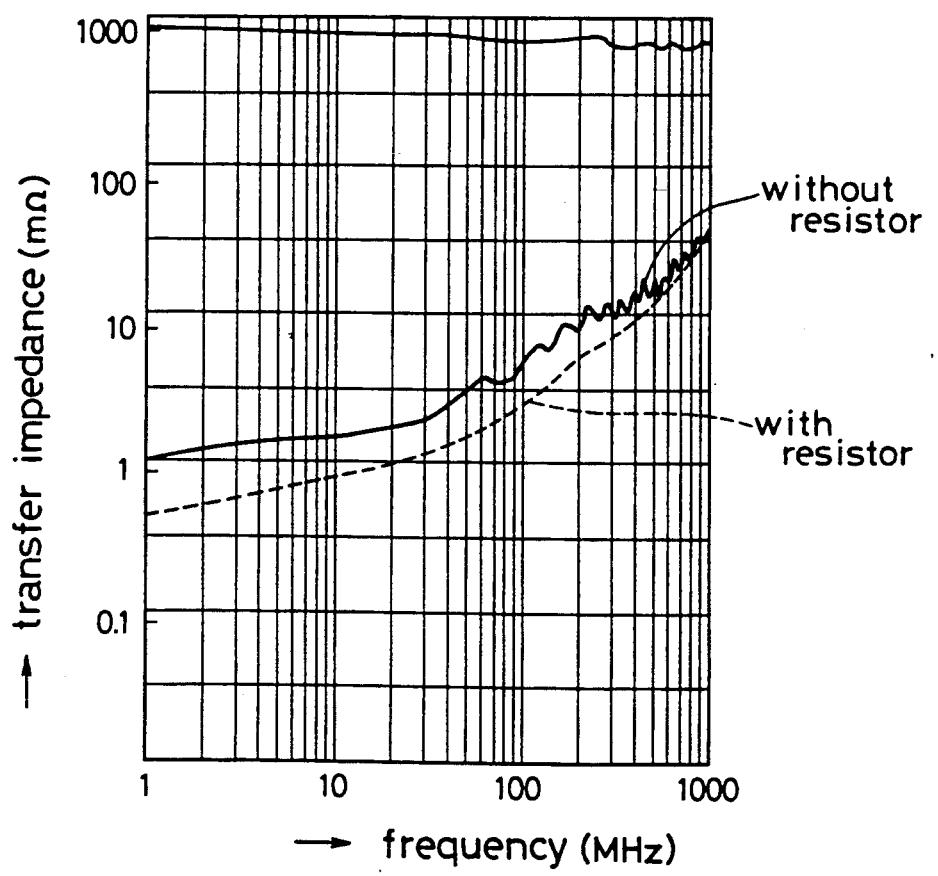
FIG. 9 is a graph of the transfer impedance data measured with and without a resistor.

FIG. 9 is a graph showing measurement data which confirms the effect of the provision of the serial resistors 46a and 46b. Here, the electromagnetic wave shielding material of the above-mentioned sample ③ is exemplified. For comparison, FIG. 9 shows the measurement data obtained by the conventional measurement device without the serial resistors 46a and 46b. As is apparent from FIG. 9, without the serial resistors 46a and 46b, the data shows humps over a certain frequency range (in this example, about 50 MHz) due to reflection. With the serial resistors 46a and 46b, the reflection can be eliminated to provide stable measurement. It is preferable that the space between the serial resistors 46a and 46b, and the sample T is set less than 0.2 times as large as the wavelength of the maximum frequency to be used. If the frequency used is very low and the largeness of the device is small enough as compared to the wave length of the frequency used, the serial resistors 46a and 46b can be omitted.

In the above-described preferred embodiments, in the inner conductors 4a and 4b, the inner contacts 44a and 44b are slidably engaged with respect to the head parts 42a and 42b, so that it is convenient to exchange the electromagnetic wave shielding material T or the like. As shown in FIG. 10, the inner conductor 4a on the left side of the drawing may incorporate the head and the inner contact while the other inner contact 44b only may be as shown in FIG. 10. When low frequency is used to measure the transfer impedance of the electromagnetic wave shielding material T, the outer contact 3 can be omitted.

Figure 11:
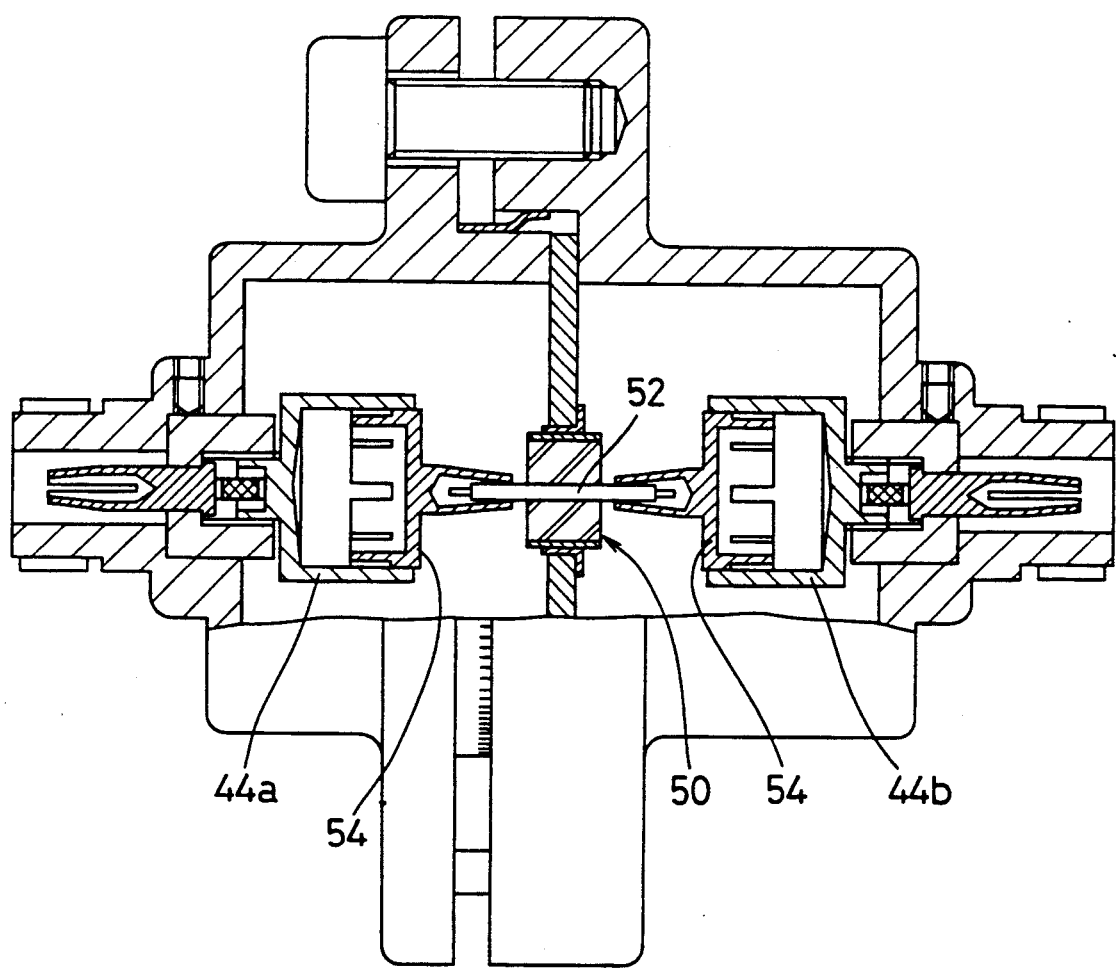
FIG. 11 is a side view of a further transfer impedance testing fixture to measure a transfer impedance of a thru-type capacitor.

In the above preferred embodiments, the measurement of the transfer impedance of the electromagnetic wave shielding material T is exemplified. Additionally, as shown in FIG. 11, the transfer impedance of a thru-type capacitor 50 can be measured by the testing fixture of the present invention. In this case, a central conductor 52 of the thru-type capacitor 50 is electrically connected with a specific jig 54 with slitting, so that the jig 54 is engaged with the inner contacts 44a and 44b.

While only certain embodiments of the present invention have been described, it will be apparent to those skilled in the art that various modifications may be made therein without departing from the spirit and scope of the present invention as claimed.

What is claimed is:

1. A measurement apparatus for measuring transfer impedance of an electromagnetic wave shielding material comprising:

a pair of opposing coaxial reducers, each comprising a cylindrical outer conductor and an inner conductor disposed therein, each of said outer conductors being provided with a flange at an outer circumferential portion for engaging said pair of coaxial reducers together;

contacting parts positioned at first ends of said outer conductors;

outer connectors positioned at respective second ends of said outer conductors, each of said inner conductors including head parts positioned at inside portions thereof and inner connectors positioned at respective outside portions thereof, said contacting parts of said outer conductors and said head parts of said inner conductors supporting the electromagnetic wave shielding material, said outer connectors of said outer conductors and said inner connectors of said inner conductors coupled to coaxial cable; and inner contacts, provided between said head parts and said inner connectors in at least one of said inner conductors, said inner contacts being slidably engaged against said head parts.

2. The measurement apparatus as set forth in claim 1, further comprising serial resistor means positioned in each of said inner conductors, said serial resistor means having an impedance approximately identical to characteristic impedance of the measurement apparatus for impedance matching.

3. The measurement apparatus as set forth in claim 1, further comprising an annular outer contact slidably interposed between said outer circumferential portions of said outer conductors in said pair of coaxial reducers, said annular outer contact having a longitudinal length to be in contact with said outer conductors.

4. The measurement apparatus as set forth in claim 2, further comprising an annular outer contact slidably interposed between said outer circumferential portions of said outer conductors in said pair of coaxial reducers, said annular outer contact having a longitudinal length to be in contact with said outer conductors.

5. The measurement apparatus as set forth in claim 4, one end of said annular outer contact is fixed to said first end of one of said outer conductors while the other end of said annular outer contact is in contact with said flange of the other of said outer conductors.

6. The measurement apparatus as set forth in claim 4, said annular outer contact comprises an annular element with a U-shaped section.

7. The measurement apparatus as set forth in claim 1, said outer conductors are plated with silver and said inner conductors are plated with gold.

8. The measurement apparatus of claim 7, said outer conductors being plated with silver and said inner conductors being plated with gold.

9. A measurement apparatus for measuring transfer impedance of an electromagnetic wave shielding material comprising:
first and second coaxial reducers, each including first and second opposing ends with a flange portion formed within each of said first ends, said flange portions adjustably coupled together at outer circumferential portions thereof,
said first and second coaxial reducers each comprising an outer conductor of cylindrical shape including said flange portions and an inner conductor disposed therein, said outer conductors each including a contact face for supporting the electromagnetic wave shielding material,
said inner conductors each comprising an inner contact of cylindrical shape fixedly mounted to said first and second coaxial reducers respectively and a head part of cylindrical shape with a first end adjustably fitting within said inner contact to provide electrical conduction therebetween and an opposing second end supporting the electromagnetic shielding material through a conducting disk; and
an annular conducting portion, slidably fixed to said first ends of said first and second coaxial reducers, for providing electrical contact between said outer conductors through said flange portions,
a first current path provided across said inner conductors through said conducting disk, a second current path provided across said outer conductors through said annular conducting portion and a third current path provided across said outer conductor of said first coaxial reducer to said inner conductor of said second coaxial reducer through the electromagnetic wave shielding material and said conducting disk.

10. The measurement apparatus of claim 9, further comprising an insulating plate disposed along said contact face of said second outer conductor for supporting said disk conductor against the electromagnetic wave shielding material.

11. The measurement apparatus of claim 10, said inner conductors further comprising first and second inner connectors respectively coupled to said inner contacts through corresponding first and second resistors which match a characteristic impedance of the measurement apparatus.

12. The measurement apparatus of claim 11 comprising a first port coupled to signal generator means through said second end of said outer conductor and said inner contact of said first coaxial reducer and a second port coupled to level meter means through said second end of said outer conductor and said inner contact of said second coaxial reducer.

13. The measurement apparatus of claim 9, said annular conducting portion comprising an annular element with a U-shaped section.

* * * * *